United States Patent
Shiomi et al.

(10) Patent No.: US 6,734,461 B1
(45) Date of Patent: May 11, 2004

(54) SIC WAFER, SIC SEMICONDUCTOR DEVICE, AND PRODUCTION METHOD OF SIC WAFER

(75) Inventors: Hiromu Shiomi, Suita (JP); Tsunenobu Kimoto, Kyoto (JP); Hiroyuki Matsunami, Yawata (JP)

(73) Assignees: Sixon Inc., Kyoto (JP); Kansai Electric Power C.C., Inc., Osaka (JP); Mitsubishi Corporation, Tokyo (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/070,472

(22) PCT Filed: Sep. 6, 2000

(86) PCT No.: PCT/JP00/06055

§ 371 (c)(1),
(2), (4) Date: Mar. 7, 2002

(87) PCT Pub. No.: WO01/18872

PCT Pub. Date: Mar. 15, 2001

(30) Foreign Application Priority Data

Sep. 7, 1999 (JP) ............................................ 11-253152

(51) Int. Cl.[7] .................. H01L 31/0312; H01L 31/072; H01L 29/04

(52) U.S. Cl. .......................... 257/77; 257/627; 257/628; 257/194

(58) Field of Search .......................... 257/77, 627, 628, 257/194

(56) References Cited

U.S. PATENT DOCUMENTS 5,641,975 A * 6/1997 Agarwal et al. ............... 257/76
5,877,515 A * 3/1999 Ajit ............................. 257/76

FOREIGN PATENT DOCUMENTS

| EP | 1243674 A1 | 9/2002 |
|----|-----------|--------|
| JP | 59-48792 | 11/1984 |
| JP | 3-171772 | 7/1991 |
| JP | 5-262599 | 10/1993 |
| JP | 7-267795 | 10/1995 |
| JP | 8-245299 | 9/1996 |
| JP | 10-17399 | 1/1998 |
| JP | 10-107263 | 4/1998 |
| JP | 2804860 | 7/1998 |
| JP | 10-182296 | 7/1998 |
| JP | 11-214405 | 8/1999 |

* cited by examiner

Primary Examiner—George Eckert
Assistant Examiner—Joseph Nguyen
(74) Attorney, Agent, or Firm—McDermott, Will & Emery

(57) ABSTRACT

A SiC wafer comprises a 4H polytype SiC substrate 2 in which the crystal plane orientation is substantially {03-38}, and a buffer layer 4 composed of SiC formed over this SiC substrate 2. The {03-38} plane forms an angle of approximately 35° with respect to the <0001> axial direction in which micropipes and so forth extend, so micropipes and so forth are eliminated at the crystal sides, and do not go through to an active layer 6 on the buffer layer 4. Lattice mismatching between the SiC substrate 2 and the active layer 6 is suppressed by the buffer layer 4. Furthermore, anisotropy in the electron mobility is low because a 4H polytype is used. Therefore, it is possible to obtain a SiC wafer and a SiC semiconductor device with which there is little anisotropy in the electron mobility, and strain caused by lattice mismatching can be lessened, as well as a method for manufacturing these.

13 Claims, 11 Drawing Sheets

Fig.11

| CRYSTAL PLANE ORIENTATION | 4H-SiC(0001)8° OFF | | 4H-SiC(03$\bar{3}$8) | | 4H-SiC(0$\bar{3}$38) | |
|---|---|---|---|---|---|---|
| CURRENT DIRECTION | <11$\bar{2}$0> | <1$\bar{1}$00> | <11$\bar{2}$0> | <03$\bar{3}$16> | <11$\bar{2}$0> | <03$\bar{3}$16> |
| CHANNEL MOBILITY (cm²/Vs) | 4.8 | 5.6 | 93 | 108 | 96 | 112 |
| THRESHOLD VOLTAGE (V) | 7.9 | 7.8 | 2.4 | 2.5 | 2.4 | 2.3 | ent
SIC WAFER, SIC SEMICONDUCTOR DEVICE, AND PRODUCTION METHOD OF SIC WAFER

TECHNICAL FIELD

This invention relates to a SiC wafer suited to semiconductor electronic parts, to a SiC semiconductor device equipped with this SiC wafer, and to a method for manufacturing a SiC wafer.

BACKGROUND ART

Recent years have witnessed a great deal of research into compound semiconductors made from light elements, such as silicon carbide (SiC) and gallium, nitride (GaN). Because they are made from light elements, such compound semiconductors have high bonding energy, and as a result they are characterized by a large energy forbidden band width (band gap), dielectric breakdown field, and thermal conductivity. Thanks to this wide band gap, these compound semiconductors are drawing attention as materials for power devices of high efficiency and high voltage resistance, high frequency power devices, devices with high operating temperatures, and devices that emit blue to ultraviolet light. However, because of their high bonding energy, these compounds do not melt even at high temperature at atmospheric pressure, making it difficult to grow bulk crystals by recrystallization of a melt, which is used with other semiconductors such as silicon (Si).

For instance, using SiC as a semiconductor material requires that high-quality single crystals of a certain size be obtained. Consequently, pieces of SiC single crystals used to be obtained by a method that makes use of a chemical reaction, called the Atchison process, or a method that makes use of sublimation recrystallization, called the Rayleigh process.

Today, single crystals of silicon carbide produced by these methods are used for substrates, over which SiC ingots are grown by a modified Rayleigh process involving sublimation recrystallization, and these SiC ingots are then sliced and mirror polished to manufacture a SiC substrate. On this substrate are grown SiC single crystals of the targeted scale by vapor phase epitaxial growth or liquid phase epitaxial growth, thereby forming an active layer of controlled film thickness and impurity density, and this product is used to produce SiC semiconductor devices such as pn junction diodes, Schottky diodes, and various types of transistors.

Nevertheless, of the above methods, the Atchison process involves heating a mixture of quartz and coke in an electric furnace, and precipitating crystals by spontaneous nucleation, so the impurity content is high, and it is difficult to control the crystallographic plane and shape of the resulting crystals. The Rayleigh process also involves growing crystals by spontaneous nucleation, which again makes it difficult to control the crystallographic plane and shape of the crystals.

With the modified Rayleigh process, such as with the invention disclosed in Japanese Patent Publication S59-48792, a large SiC ingot is obtained in the form of a single crystal polymorph. However, this ingot usually contains large defects called micropipes (small holes that go through in the <0001> axial direction), in a density of about 1 to 50 $cm^{-2}$. There are also screw dislocations having a Burger's vector in the c axial direction in a density of about $10^3$ to $10^4$ $cm^{-2}$.

A substrate having a SiC {0001} plane, or provided with an off angle of 3 to 8 degrees from this plane, is usually used for epitaxial growth. It is known that most of the micropipe defects or screw dislocations. present in a substrate pass through to the SiC epitaxial growth layer, and that the device characteristics will be markedly inferior if a SiC device produced using an epitaxial growth layer contains micropipe defects. Micropipe defects are therefore the greatest obstacle to manufacturing a large capacity (large current and high voltage resistance) SiC semiconductor device at a high yield.

When homoepitaxial growth of SiC is performed using an ordinary SiC substrate having a SiC {0001} plane, or having an off angle of several degrees from this plane, atomic step bunching tends to occur on the crystal surface. If the extent of this step bunching is large, there is an increase in the surface roughness of the SiC epitaxial growth layer, and the flatness suffers at the metal-oxide-semiconductor (MOS) interface, so there is a decrease in the inversion layer channel mobility of an MOS field effect transistor (MOSFET). Flatness also suffers at a pn junction or Schottky barrier interface, field bunching occurs at the junction interface, and this leads to problems such as decrease voltage resistance and increased leakage current.

There are numerous crystal polymorphs of SiC. Of these, the 4H polytype (4H—SiC) has high mobility, and its donor and acceptor ionization energy is low, which means that this might be an ideal SiC polytype for the production of SiC semiconductor devices. Nevertheless, when an inversion type of MOSFET is fabricated using an epitaxial growth layer over a substrate having a 4H—SiC {0001} plane, or provided with an off angle of 3 to 8 degrees from this plane, the channel mobility is extremely low, about 1 to 20 $cm^2/Vs$, and this precludes obtaining a high performance transistor.

In an effort to solve these problems, Japanese Patent Publication 2,804,860 discloses performing growth by the modified Rayleigh process using seed crystals having a plane other than the (0001) of SiC, such as a (1-100) plane, so as to obtain a SiC ingot with fewer micropipes. When epitaxial growth is. performed over a SiC (1-100) plane, however, this tends to result in stacking faults, which are planar defects that occur during growth, making it difficult to obtain SiC single crystals that are high enough in quality for the production of semiconductor devices.

In addition to the use of a SiC (1-100) substrate, research has also been conducted in recent years into producing SiC wafers using a 6H polytype SiC (11-20) substrate. When this 6H polytype SiC (11-20) substrate is used, micropipes and screw dislocations extending in the <0001> axial direction do not reach the epitaxial layer on the substrate, which affords a reduction in micropipe defects within this epitaxial layer.

DISCLOSURE OF THE INVENTION

However, the following problems have been encountered with SiC wafers produced using the above-mentioned 6H polytype SiC (11-20) substrate. When a SiC epitaxial layer is grown over a conventional SiC (11-20) substrate, strain develops at the interface between the SiC epitaxial growth layer and the SiC substrate due to lattice mismatching attributable to the difference in impurity densities. This strain adversely affects the crystallinity of the epitaxial growth layer, and hampers efforts to produce a high-quality SiC epitaxial growth layer.

Furthermore, the anisotropy of electron mobility becomes a problem when a device is fabricated using a 6H polytype SiC (11-20) substrate. Specifically, among the 6H—SiC crystals, the electron mobility in the <0001>axial direction is only about 20 to 30% of the mobility in the <1-100> and <11-20> directions. Accordingly, anisotropy is three to five times greater for the in-plane electrical conduction of a growth layer on a 6H—SiC (11-20) plane. Still another problem is that the stacking faults tend to be exposed on the surface in the case of the (1-100) plane or (11-20) plane.

The present invention was conceived in light of this situation, and it is an object thereof to provide a SiC wafer with which there is less anisotropy in electron mobility when used as a semiconductor device, and less strain is caused by lattice mismatching between the SiC substrate and the SiC epitaxial growth layer, as well as a semiconductor device provided with this wafer, and a method for manufacturing a SiC wafer.

In order to achieve the stated object, the SiC wafer according to the present invention is characterized in that it comprises a 4H polytype SiC substrate in which the crystal plane orientation is substantially {03-38}; and a buffer layer composed of SiC formed over the SiC substrate.

Also, the method for manufacturing a SiC wafer according to the present invention is characterized in that a buffer layer composed of SiC is grown over a 4H polytype SiC substrate in which the crystal plane orientation is substantially {03-38}.

With the above-mentioned SiC wafer and the method for manufacturing this wafer, the SiC substrate in which the crystal plane orientation is substantially {03-38} is used. Here, this {03-38} plane is inclined about 35° to the <0001> axial direction in which the micropipes and screw dislocations extend. Therefore, even if a SiC active layer is epitaxially grown over this SiC wafer, the micropipes and screw dislocations reach the sides and are eliminated as a result of the inclination, and this suppresses the number of micropipes and screw dislocations that pass through to the other side, as well as the number that are exposed on the surface.

Also, the occurrence of stacking faults can be greatly suppressed when an epitaxial growth layer is produced over the SiC {03-38} plane. These stacking faults occur in a planar direction that is perpendicular to the <0001> axial direction, but the {03-38} plane is inclined by about 55° to the plane in which these stacking faults occur. Therefore, fewer of the stacking faults that occur with this SiC wafer will be exposed on the surface of the wafer, just as above.

Because a 4H polytype substrate is used, which has less anisotropy of electron mobility than a 6H polytype SiC substrate, there is a reduction in the anisotropy of electron mobility in the active layer grown over the SiC wafer. Furthermore, since a buffer layer composed of SiC is formed over a SiC substrate, when a SiC active layer is grown over the SiC wafer of the present invention, strain due to lattice mismatching between the SiC substrate and the SiC active layer can be prevented from occurring in this SiC active layer.

Thus, with a SiC wafer structured as above, that makes use of a 4H polytype SiC substrate with a crystal plane orientation of substantially {03-38}, and with the method for manufacturing this wafer, the result is a SiC wafer with which there is less anisotropy in electron mobility, and less strain is caused by lattice mismatching between the SiC substrate and the SiC epitaxial growth layer. A SiC semiconductor device equipped with a SiC wafer such as this will be of high quality.

The plane used for the SiC substrate is not limited to the {03-38} plane, and the same effect of reducing the number of micropipes and screw dislocations that pass through to the other side, suppressing stacking faults, and so forth can also be achieved if the plane is inclined to the {03-38} plane by a specific off angle α. Favorable epitaxial crystals can be obtained if this off angle α is within a range of about 10°. It is preferable for this off angle α to be no more than 5°. An off angle α of 3° or less is better yet.

BRIEF DESCRIPTION OF THE DRAWINGS

FIG. 11 is a table of the channel mobility of a MOSFET produced using a plurality of SiC substrates.

BEST MODES FOR CARRYING OUT THE INVENTION

Favorable embodiments of the SiC wafer, SiC semiconductor device, and SiC wafer manufacturing method pertaining to the present invention will now be described in detail through reference to the appended drawings. Similar elements are labeled the same, and will not be described redundantly.

The lattice direction and lattice plane of crystals will sometimes be mentioned in the description of embodiments and examples, so the notation used for lattice direction and lattice plane will be described here. A single direction is indicated by [ ], a class of directions by < >, a single plane by ( ), and a family of planes by { }. Negative indexes are indicated by putting a bar ("–") over a number in crystallography, but for the sake of simplicity in producing this Specification, a negative sign will be placed before a number herein.

Figure 1:
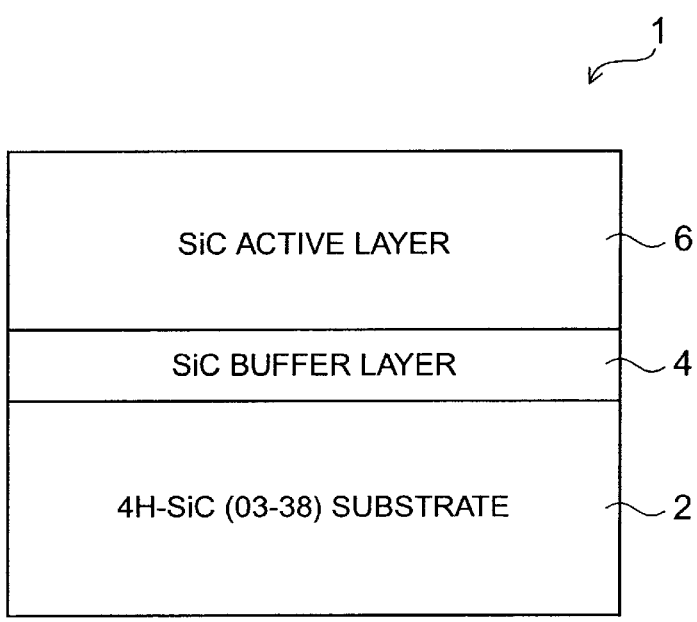
FIG. 1 is a side view illustrating the structure in an embodiment of a SiC wafer.

FIG. 1 is a side view illustrating the structure in an embodiment of a SiC wafer 1 pertaining to the present invention. The SiC wafer 1 comprises a 4H—SiC {03-38} substrate 2 that is a 4H polytype (the H stands for hexagonal, and the 4 indicates a crystal structure in which four atomic layers make up one period), a buffer layer 4 composed of SiC and formed over this 4H—SiC {03-38} substrate 2, and an active layer 6 composed of SiC used for device production and formed over this buffer layer 4. The conductivity type of the layers 2 to 6 may be such that all three are n-type, or they may all be p-type. The conductivity may also vary from layer to layer depending on the device structure to be produced.

The {03-38} plane of a 4H—SiC single crystal will now be described through reference to FIG. 2. As shown in the drawing, the {03-38} plane is inclined by about 55° (54.74°) to the {0001} plane, and therefore is inclined by about 35° (35.26°) to the <0001> axial direction.

Figure 2:
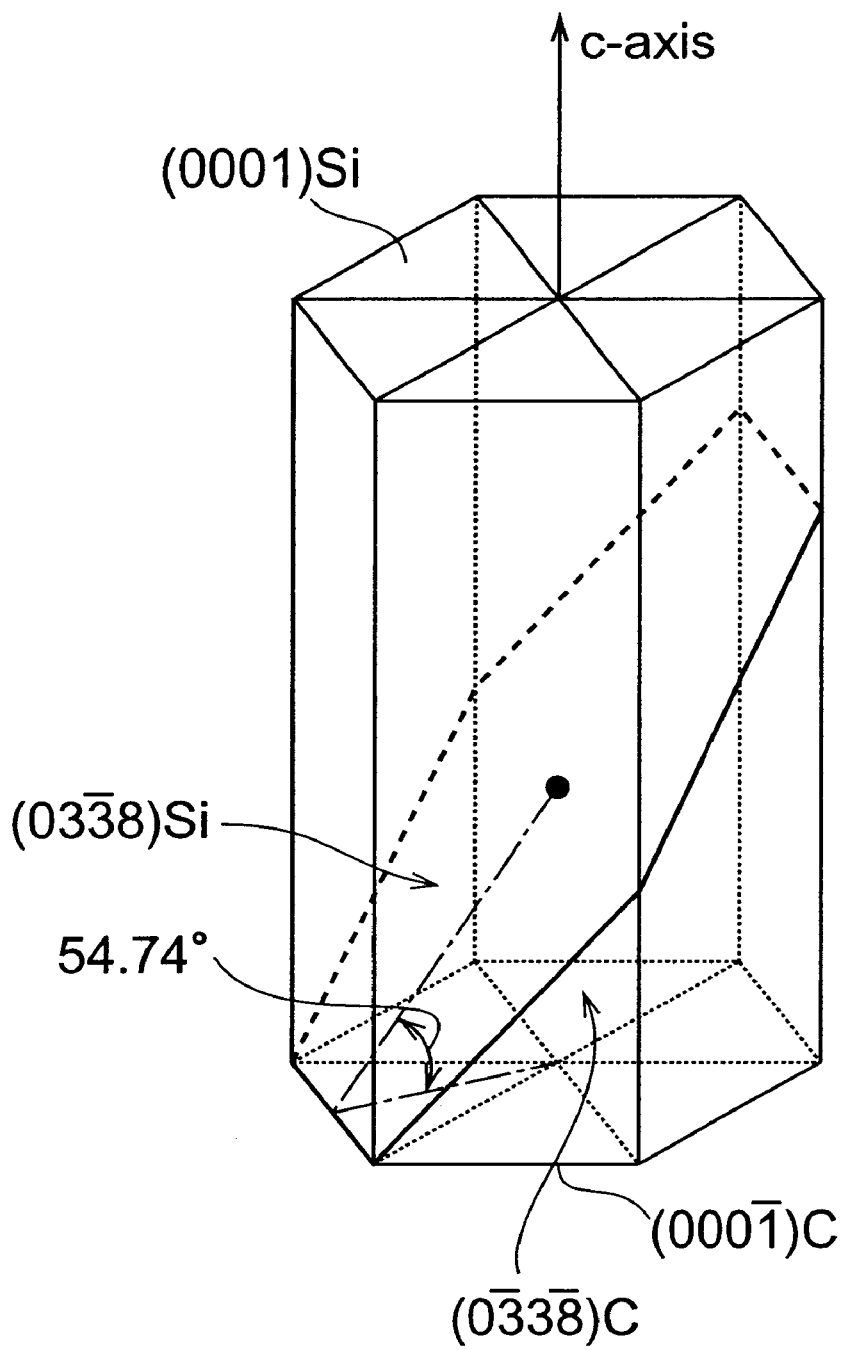
FIG. 2 is a diagram illustrating the {03-38} plane of 4H—SiC.

The 4H—SiC {03-38} plane is polar, as shown in FIG. 2, and there is a (03-38) plane near the (0001) Si plane side, and a (0-33-8) plane near the (000-1) C plane side. The substrate plane may be either the (03-38) plane or the (0-33-8) plane. Care must be taken, though, because the preferred growth conditions will vary somewhat with the crystal plane orientation.

The crystal plane orientation of the 4H—SiC {03-38} substrate 2 may be inclined somewhat from the {03-38} plane. Specifically, the same effect as with the {03-38} plane described below can be obtained by using a plane that is inclined to the {03-38} plane by a specific off angle α. A favorable SiC substrate 2 can be obtained by keeping this off angle α within a range of about 10° or less. It is preferable for this off angle α to be 5° or less, and 3° or less is better still.

Next, the method for manufacturing the SiC wafer 1 in this embodiment will be described. The 4H—SiC {03-38} substrate 2 is produced, for instance, by growing an ingot by modified Rayleigh process on the 4H—SiC (000-1) plane, slicing this ingot so that it has an angle of 35° in the <1-100> direction with respect to the growth direction, and then mirror polishing the slice. Alternatively, a 4H—SiC {03-38} ingot may be grown by modified Rayleigh process using 4H—SiC {03-38} crystals produced as above as seed crystals, and then slicing this ingot perpendicular to the growth direction.

Here, the thickness of the 4H—SiC {03-38} substrate 2 should be within a range of approximately 150 µm to approximately 400 µm. The effective donor density or the effective acceptor density should be within a range of approximately $5 \times 10^{17}$ cm$^{-3}$ to approximately $5 \times 10^{19}$ cm$^{-3}$.

The 4H—SiC {03-38} substrate 2 is then given a mirror finish, after which the buffer layer 4 and the active layer 6 are grown epitaxially by chemical vapor deposition (CVD), which affords excellent surface flatness in the grown layers and excellent control of film thickness and impurity doping. More specifically, first the 4H—SiC {03-38} substrate 2 is washed with an organic solvent, aqua regia, hydrofluoric acid, or the like, then rinsed with deionized water, placed on a graphite susceptor covered with a SiC film, and set in a CVD growth apparatus. This CVD growth is conducted in a normal-pressure horizontal CVD apparatus in which hydrogen (H$_2$) is used as the carrier gas, and the heating of the susceptor is accomplished by high-frequency inductive heating. After the 4H—SiC {03-38} substrate 2 is placed in a reaction furnace, gas replacement and high-vacuum evacuation are repeated a number of times, and the H$_2$ carrier gas is introduced and the CVD growth program commenced.

First, vapor phase etching is performed with HCl/H$_2$ gas at approximately 1300° C., after which the temperature of the 4H—SiC {03-38} substrate 2 is raised to about 1500° C., the raw material gas (silane (SiH$_4$), propane (C$_3$H$_8$), or the like) is introduced, and the growth of the buffer layer 4 and active layer 6 is commenced. With CVD growth, the n-type SiC buffer layer 4 with an effective donor density of approximately $10^{16}$ cm$^{-3}$ to approximately $10^{19}$ cm$^{-3}$ is grown in a thickness of approximately 0.1 µm to approximately 15 µm, after which the n-type active layer 6 with an effective donor density of approximately $10^{14}$ cm$^{-3}$ to approximately $10^{16}$ cm$^{-3}$ is grown in a thickness of approximately 5 µm to approximately 80 µm. Adding nitrogen gas during growth will control the n-type conductivity. The same applies for forming a p-type growth layer, in which case trimethylaluminum (Al(CH$_3$)$_3$) or diborane (B$_2$H$_6$) is added as an impurity raw material.

The thickness of the buffer layer 4 should be at least 0.1 µm and no more than 15 µm, with at least 0.3 µm and no more than 15 µm being particularly favorable. It is preferable for the impurity contained in the buffer layer 4 to be selected from among nitrogen, phosphorus, aluminum, and boron. The impurity density in the buffer layer 4 is preferably lower than the impurity density in the SiC substrate 2, and preferably decreases gradually from the interface with the SiC substrate 2 toward the interface with the active layer 6.

Figure 3:
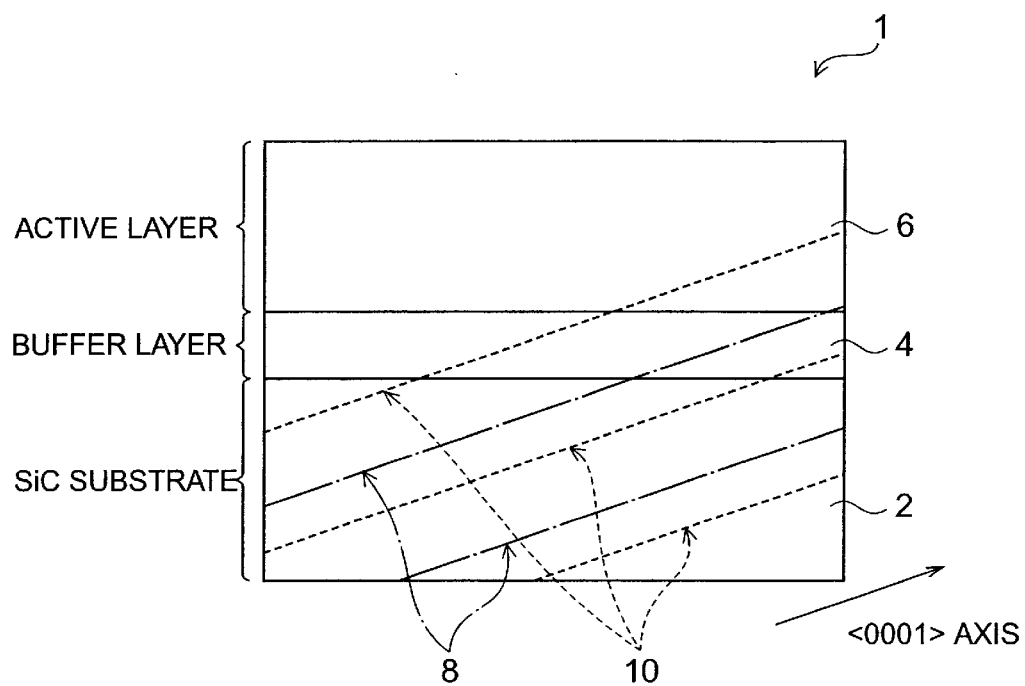
FIG. 3 is a schematic diagram illustrating micropipes and screw dislocations in a SiC substrate.

Next, the effect of the SiC wafer 1 in this embodiment will be described through reference to FIG. 3. Usually, micropipes or screw dislocations are present in a SiC substrate, and these micropipes, etc., extend in the <0001> axial direction of the SiC substrate. In FIG. 3, the one-dot chain lines indicate micropipes 8 in the SiC substrate 2, while the dashed lines indicate screw dislocations 10.

In contrast, a SiC substrate 2 with a crystal plane orientation of {03-38} is used with the SiC wafer 1 in this embodiment. This {03-38} plane is inclined about 35° to the <0001> axial direction in which the micropipes 8 and screw dislocations 10 extend. Therefore, when a growth layer is produced on this 4H—SiC {03-38} substrate 2, these micropipes 8 and screw dislocations 10 extend at an angle and are eliminated at the crystal side planes without reaching the growth layer, which keeps them from passing through to the active layer 6 and thereby being exposed on the surface. Accordingly, there are fewer defects in the active layer 6, and its flatness is better.

Also, the occurrence of stacking faults can be greatly curtailed when an epitaxial growth layer is produced on the 4H—SiC {03-38} substrate 2. Furthermore, these stacking faults occur in a planar direction that is perpendicular to the <0001> axial direction, but the {03-38} plane is inclined by about 55° to the plane in which these stacking faults occur, so fewer of the stacking faults that occur will be exposed on the surface, just as above.

This embodiment makes use of a 4H polytype, which has less anisotropy of electron mobility than a 6H polytype SiC substrate or the like, so there is a reduction in the anisotropy of electron mobility in the active layer 6 grown on the SiC wafer 1. The admixture of other polytypes is also completely prevented. Furthermore, since the buffer layer 4 composed of SiC is formed over the SiC substrate 2, strain due to lattice mismatching between the SiC substrate 2 and the SiC active layer 6 can be prevented from occurring in this SiC active layer 6.

The diligent research of the inventors has also revealed that if the thickness of the buffer layer 4 is at least 0.1 µm, and especially if it is at least 0.3 µm, strain caused by lattice mismatching can be effectively reduced, affording better crystallinity of the active layer 6. Meanwhile, keeping the thickness of the buffer layer 4 is kept to 15 µm or less will reduce the growth time and cost.

It is preferable for the density of impurities contained in the buffer layer 4 to be at least $2 \times 10^{15}$ cm$^{-3}$ but no more than $3 \times 10^{19}$ cm$^{-3}$. The reason for setting the density of impurities contained in the buffer layer 4 to this range is that if the impurity density is less than $2 \times 10^{15}$ cm$^{-3}$, there will be only minimal reduction in strain caused by lattice mismatching, but if the density is more than $3 \times 10^{19}$ cm$^{-3}$, this high concentration doping will adversely affect the crystallinity of the buffer layer 4 itself.

Various SiC semiconductor devices can be manufactured using the SiC wafer 1 of this embodiment. For instance, such a SiC semiconductor device can be configured so that the surface has a Schottky barrier of metal/SiC, or has a pn junction formed by epitaxial growth or ion implantation. The device may also be an MOS type having an oxide film formed by thermal oxidation or chemical vapor deposition as a gate insulation film, or may have an oxide film formed by thermal oxidation or chemical vapor deposition as part of a surface protection film.

As discussed above, the SiC wafer 1 has very little anisotropy of electron mobility, and almost no strain is caused by lattice mismatching between the SiC substrate 2 and the active layer 6, so this semiconductor device offers very high performance.

More specifically, the surface flatness of the active layer 6 is particularly good, so there is a marked reduction in field concentration at a pn junction formed by epitaxial growth or a Schottky barrier interface formed on the epitaxial growth surface, which makes it easier to increase the voltage resistance of the device. Moreover, there are fewer atomic bonds per unit of surface area in SiC {03-38} plane than in the SiC {0001} plane, so there is a reduction in the interface level at an oxide film/SiC MOS interface, which allows a higher quality MOS interface to be produced, and affords a higher performance MOS transistor.

In addition to those listed above, the 4H—SiC {03-38} plane also has various other advantages in terms of its characteristics and method of manufacture.

First of all, crystals in which the 4H—SiC {03-38} plane is used recover their crystallinity more easily through heat treatment (annealing).

When semiconductor single crystals undergo ion implantation, they usually suffer some implantation damage, so heat treatment (annealing) must be performed to restore the damaged crystallinity. In the case of SiC, this annealing is performed at a high temperature of 1500 to 1700° C. in order to sufficiently raise the electrical activation of the ion-implanted impurities.

If a completely amorphous region is formed by ion implantation in the SiC, crystallinity cannot be adequately restored even if high temperature annealing is performed. Consequently, when the implantation dose is large and the implantation energy is high, high temperature implantation is performed in which the sample is heated during the ion implantation. However, high temperature annealing after ion implantation, and high temperature implantation, both impose various limitations on the production of the device. They also drive up the manufacturing cost.

These problems with high temperature annealing and high temperature implantation are particularly pronounced when the SiC {0001} plane or a plane close to this is used. In contrast, using the above-mentioned 4H—SiC {03-38} plane makes it possible to solve the above-mentioned problems encountered with SiC.

For instance, when samples of the 4H—SiC {0001} plane and the 4H—SiC {03-38} plane are both annealed following ion implantation under the same conditions, sufficient electrical activation can be achieved with the sample of the 4H—SiC {03-38} plane by annealing at a temperature that is 200 to 400° C. lower than with the sample of the {0001} plane. It has also been found that even if a completely amorphous region is formed by ion implantation because of the large implantation dose or for another such reason, with the sample of the 4H—SiC {03-38} plane, recrystallization will proceed smoothly and a recovery to good quality 4H—SiC {03-38} single crystals will be achieved by annealing at 1000 to 1500° C.

The above-mentioned problems with ion implantation and annealing are believed to lower the recrystallization efficiency because when the SiC {0001} plane is used, the nucleation of cubic 3C—SiC that is stable at low temperatures occurs in the course of recrystallization, and stacking faults tend to occur. In contrast, when the 4H—SiC {03-38} plane is used, there is virtually no possibility of 3C—SiC nucleation or the like, and good recrystallization can therefore be attained even at a relatively low temperature.

Also, crystals in which the 4H—SiC {03-38} plane is used have superior cleavability.

4H—SiC {03-38} crystals readily cleave in the <0001> and <03-316> directions, which are perpendicular to each other. Therefore, after various device structures have been produced, dividing them up into square, rectangular, or other such shapes is extremely easy. This is in sharp contrasts to SiC {0001} crystals which are fairly difficult to cleave, and which tend to become triangular when cleaved.

Crystals in which the 4H—SiC {03-38} plane is used have the following characteristics with respect to impurity doping.

Growth experiments were conducted by CVD, which revealed that the efficiency at which an impurity is incorporated depends on the crystal plane orientation of the substrate. In specific terms, the incorporation efficiency of nitrogen is in the following order.

(000-1)>(0-33-8)>(03-38)>(0001)

The incorporation efficiency of aluminum and boron is in the following order.

(0001)>(03-38)>(0-33-8)>(000-1)

It was found from the above results that the (0001) Si plane most readily becomes p-type, and the (000-1) C plane most readily becomes n-type. In contrast, with the (03-38) plane and (0-33-8) plane, the impurity incorporation efficiency is located in between these. Therefore, with the (03-38) plane and (0-33-8) plane, devices can be produced while maintaining good control over n-type and p-type conductivity. More to the point, by varying the conditions, such as the amount of impurity raw material added, the raw material gas flow ratio (such as the C/Si ratio), and the growth temperature, it is possible to easily perform valence electron control over a wide range of about $1\times10^{14}$ cm$^{-3}$ to $5\times10^{19}$ cm$^{-3}$ for both n- and p-types.

Examples will now be given for the above embodiment, but the present invention is not limited to or by the examples given below.

EXAMPLE 1

Example 1 will be described through reference to FIG. 1. In this example, an n-type active layer 6 was grown by chemical vapor deposition (CVD) over an n-type 4H—SiC {03-38} substrate 2 in order to examine how many micropipes and screw dislocations pass from the SiC substrate to the SiC active layer, and the flatness of the surface of the active layer 6. For the 4H—SiC {03-38} substrate 2, the active layer 6 was grown on both a 4H—SiC (03-38) substrate and a 4H—SiC (0-33-8) substrate. For the sake of comparison, the active layer was at the same time grown on substrates in which the planar direction was the 4H—SiC (1-100) plane and a plane 8 degrees off the (0001) plane (<11-20> direction), and these products were evaluated.

The 4H—SiC (03-38), (0-33-8), and (1-100) substrates were produced by growing an ingot by modified Rayleigh process on a 4H—SiC (000-1) substrate, slicing this ingot at angles of 55°, 55°, and 90° in the <1-100> direction with respect to the growth direction, and mirror polishing the slices. The substrates were all n-type, the effective donor density determined from the capacity-voltage characteristics of a Schottky barrier was $1 \times 10^{18}$ cm$^{-3}$ to $3 \times 10^{18}$ cm$^{-3}$, and the thickness was approximately 380 μm These substrates were etched with molten potassium hydroxide (KOH) for 10 minutes at 500° C., and as a result it was found that defects were present in a micropipe density of about 10 cm$^{-2}$ to 100 cm$^{-2}$ and a screw dislocation density of about $5 \times 10^3$ cm$^{-2}$ to $2 \times 10^4$ cm$^{-2}$. The (03-38), (0-33-8), and (1-100) planes were subjected to inclined polishing to bring out a plane about 10 degrees inclined from the (0001) plane, this plane was etched and then examined, and the defect density was estimated.

The substrate that had undergone KOH etching were then re-polished to a mirror finish, and CVD growth was performed. These substrates were washed with an organic solvent, aqua regia, and hydrofluoric acid, then rinsed with deionized water, placed on a graphite susceptor covered with a SiC film, and set in a CVD growth apparatus. Gas replacement and high-vacuum evacuation were repeated a number of times, and the $H_2$ carrier gas was introduced and the CVD growth program commenced.

First, vapor phase etching was performed with HCl/$H_2$ gas at 1300° C., after which the temperature was raised to 1500° C., the raw material gas (silane (SiH$_4$), propane (C$_3$H$_8$), or the like) was introduced, and growth was commenced. With CVD growth, an n-type SiC buffer layer with an effective donor density of $3 \times 10^{17}$ cm$^{-3}$ to $4 \times 10^{17}$ cm$^{-3}$ was grown in a thickness of 2.6 μm, after which an n-type active layer with an effective donor density of $1 \times 10^{16}$ cm$^{-3}$ to $2 \times 10^{16}$ cm$^{-3}$ was grown in a thickness of 12 μm.

The n-type conductivity was controlled by adding nitrogen gas during the growth. The main growth conditions here are given below. Since the impurity incorporation efficiency is generally different between the (0001) plane and the (03-38) plane and (0-33-8) plane, the doping gas flux should be adjusted by means of the crystal plane orientation of the substrate.

Buffer Layer
- SiH$_4$ flux: 0.30 sccm
- C$_3$H$_8$ flux: 0.20 sccm
- N$_2$ flux: $1 \times 10^{-2}$ to $6 \times 10^{-2}$ sccm
- H$_2$ flux: 3.0 slm
- substrate temperature: 1500° C.
- growth time: 60 minutes Active Layer
- SiH$_4$ flux: 0.50 sccm
- C$_3$H$_8$ flux: 0.50 sccm
- N$_2$ flux: $3 \times 10^{-3}$ to $2 \times 10^{-2}$ sccm
- H$_2$ flux: 3.0 slm
- substrate temperature: 1500° C.
- growth time: 180 minutes The surface of the epitaxially grown active layer 6 was observed under a differential interference optical microscope, which revealed that a mirror surface had been obtained on the 4H (03-38), (0-33-8), and (0001) 8-degree off substrates, but bumpy streaks or grooves running partially in the <11-20> direction were seen on the 4H (1-100) substrate. These streak defects on the 4H (1-100) substrate were also observed in the growth layer on the 6H (1-100) plane. The occurrence of these streak defects was reduced somewhat when CVD growth was performed under growth conditions of low supersaturating (such as a low raw material gas flux), or by optimizing the surface treatment of the substrate prior to growth, but could not be eliminated completely.

The active layer surface of a substrate measuring 15×20 mm was also observed and the density of surface defects (not necessarily the same as dislocations and other such structural defects) was estimated, which was found to be $4 \times 10^2$ cm$^{-2}$ with the 4H (03-38) substrate, $3 \times 10^2$ cm$^{-2}$ with the 4H (0-33-8) substrate, $8 \times 10^3$ cm$^{-2}$ with the (1-100) substrate, and $2 \times 10^3$ cm$^{-2}$ with the (0001) 8-degrees off substrate, so the active layer was best on the 4H {03-38} substrate.

Figure 4A:
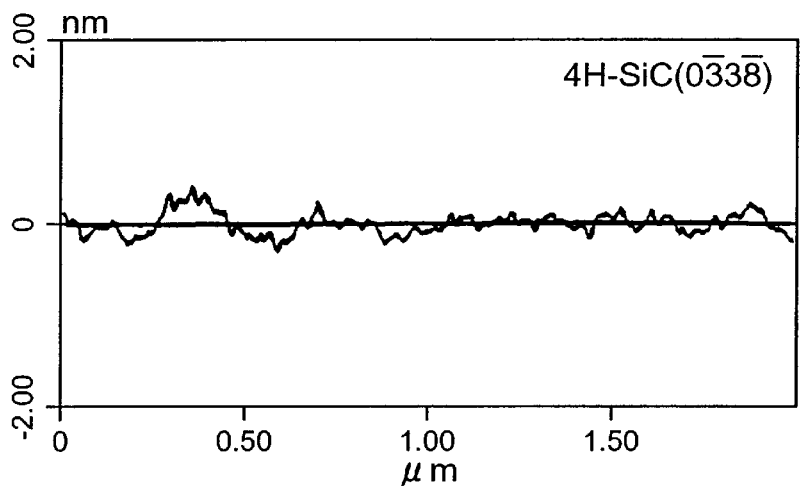
FIGS. 4A to 4C are graphs of the surface state of a SiC active layer grown over various SiC substrates.
Figure 4B:
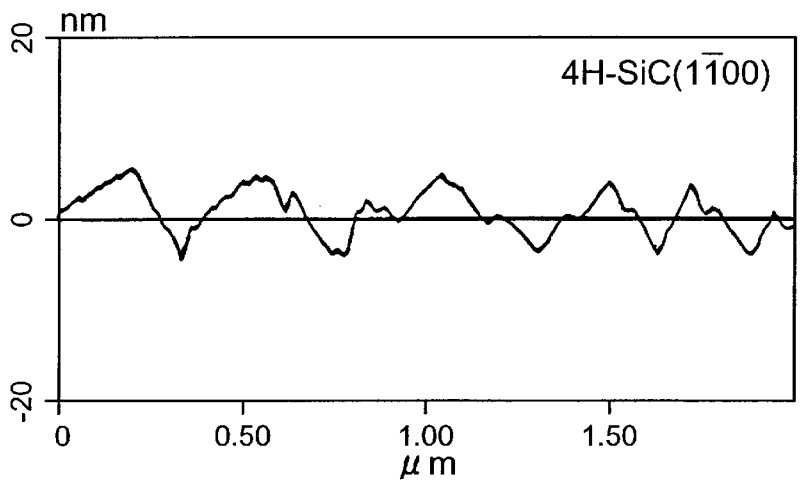
Figure 4C:
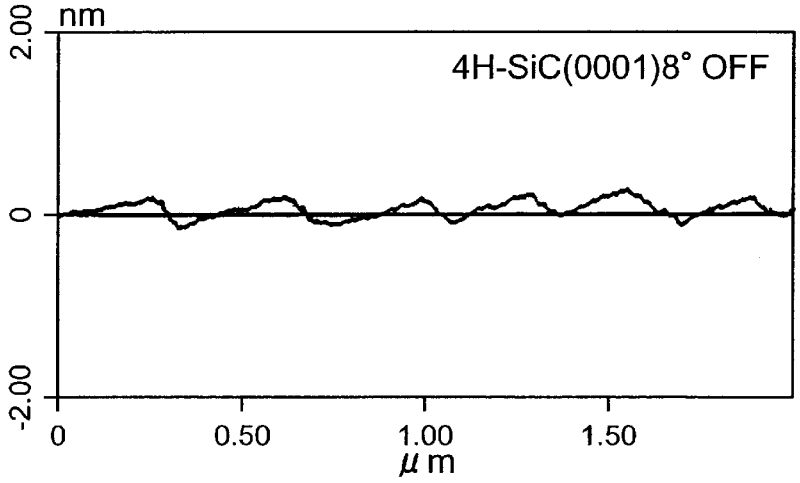

FIGS. 4A to 4C are graphs of the surface shape profiles obtained by atomic force microscope (AFM) observation, with FIG. 4A showing the surface shape of the active layer on a 4H—SiC (0-33-8) substrate, FIG. 4B on a 4H—SiC (1-100) substrate, and FIG. 4C on a 4H—SiC (0001) 8-degrees off substrate.

Of these, the surface of the active layer formed on the (1-100) substrate was jaggedly bumpy, as shown in FIG. 4B, even if an area without the above-mentioned deep grooves (about 100 to 300 nm deep) was selected. Also, FIG. 4C shows that step-like bumps originating in atomic step bunching were present on the surface of the active layer formed on the (0001) 8-degrees off substrate.

In contrast, with the active layer formed on the 4H (0-33-8) substrate, as shown in FIG. 4A, no grooves, hillocks, steps, or the like were seen at all, and a surface with extremely good flatness was obtained. Similarly, a surface with good flatness was obtained with the 4H (03-38) substrate as well. The mean square of surface roughness (Rms) when a 2×2 μm area was observed by AFM was 0.18 to 0.19 nm with the active layer formed on a {03-38} substrate, 6.4 nm on the (1-100) substrate, and 0.24 nm on the (0001) 8-degrees off substrate, so the active layer formed on the 4H {03-38} substrate was best.

Next, the structural defects in the active layer 6 were examined by etching the grown sample with molten KOH. With the active layer on the (0001) 8-degrees off substrate, the micropipe density was 18 cm$^{-2}$ and the screw dislocation density was $8 \times 10^3$ cm$^{-2}$, which are substantially the same as the values for the substrate prior to growth, and the positions of the pits produced by etching also match up well with those prior to growth.

Numerous ($1 \times 10^5$ cm$^{-2}$) polygonal pits were seen when the active layer on the (1-100) substrate was etched, and the streak defects that appeared on the surface of the active layer were even deeper. These streak-like grooves extended in the <11-20> direction, and are therefore thought to originate in stacking faults. The number of these grooves deeply etched by molten KOH was 3 to 8 cm$^{-1}$ with the (1-100) substrate prior to growth, but increased to between 30 and 200 cm$^{-1}$ after growth. It is therefore believed that CVD growth causes new stacking faults to occur when an active layer is grown on a (1-100) substrate.

In contrast, when the active layer grown on a {03-38} substrate was etched with molten KOH, the density of polygonal pits reflecting dislocations was only about $2 \times 10^3$ cm$^{-2}$, and the stacking fault density was no more than 5 cm$^{-1}$. Also, the micropipe density estimated by etching a plane of this sample that had been polished at an angle was less than 1 cm$^{-2}$, and the screw dislocation density was less than 100 cm$^{-2}$.

Specifically, using a 4H—SiC {03-38} substrate greatly limits the number of micropipes and screw dislocations that pass through from the substrate, and makes it possible to produce high-quality SiC epitaxial crystals with extremely few stacking faults. This is because, as mentioned above, the micropipes and screw dislocations extend mainly in the <0001> direction of SiC crystals (see FIG. 3), so if we use a {03-38} plane (see FIG. 2), which is a crystal plane that forms angle of about 35° to this direction, any micropipes or screw dislocations present in a SiC substrate will extend at an angle and be eliminated at the crystal side planes, without making it all the way to the active layer above. The same effect is obtained by using a plane that is inclined to the {03-38} plane by an off angle α within a specific range, as mentioned above.

EXAMPLE 2

In this example, in order to examine the effect that the buffer layer has on the active layer, an n-type 4H—SiC buffer layer was formed in various thicknesses on an n-type 4H—SiC {03-38} substrate, after which a high-purity thick film epitaxial growth layer (the active layer) was formed, and the crystallinity thereof was evaluated. The SiC substrate 2 used here was an n-type 4H—SiC {03-38} substrate produced by slicing a 4H—SiC ingot grown on 4H—SiC {03-38} seed crystals by the modified Rayleigh process. The effective donor density determined from the capacity-voltage characteristics of a Schottky barrier was $7\times10^{18}$ cm$^{-3}$ to $8\times10^{18}$ cm$^{-3}$, and the thickness was approximately 340 μm.

An n-type 4H—SiC buffer layer with a donor density of $4\times10^{17}$ cm$^{-3}$ to $5\times10^{17}$ cm$^{-3}$ was formed over this SiC substrate 2, after which a high-purity n-type 4H—SiC layer (donor density: $4\times10^{15}$ cm$^{-3}$) was grown in a thickness of approximately 24 μm. The n-type conductivity was controlled by adding nitrogen gas during growth. SiC wafers in which the thickness of the buffer layer was varied between 0.1 and 22 μm were produced, and for the sake of comparison, a SiC wafer in which a high-purity SiC active layer was grown directly on a substrate without a buffer layer being provided was also produced. The same CVD apparatus as in Example 1 was used for the CVD growth.

First, vapor phase etching was performed with HCl/H$_2$ gas at 1400° C., after which the temperature was raised to 1560° C., the raw material gas was introduced, and growth was commenced. The main growth conditions here are given below.

Figure 5:
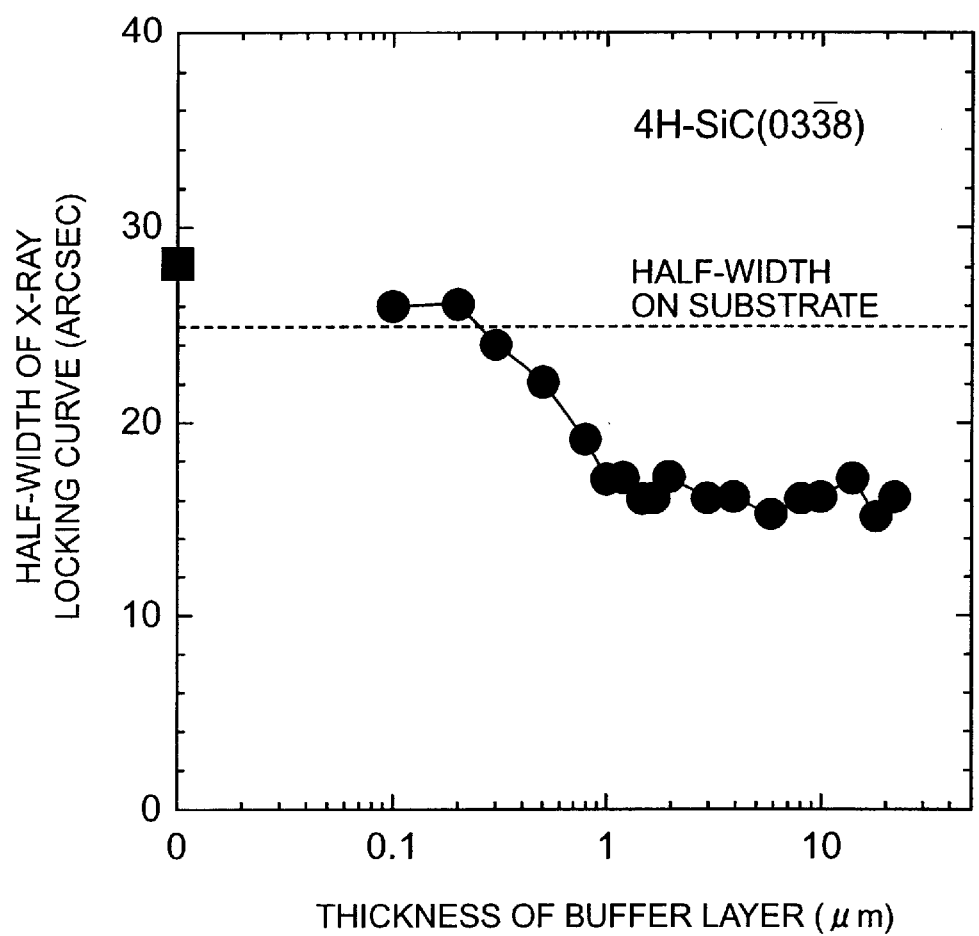
FIG. 5 is a graph of the relationship between the thickness of the buffer layer and the FWHM of an X-ray locking curve.

Buffer Layer
  SiH$_4$ flux: 0.30 sccm
  C$_3$H$_8$ flux: 0.20 sccm
  N$_2$ flux: $9\times10^{-2}$ sccm
  H$_2$ flux: 3.0 slm
  substrate temperature: 1560° C.
  growth time: 3 to 520 minutes
Active Layer
  SiH$_4$ flux: 0.50 sccm
  C$_3$H$_8$ flux: 0.66 sccm
  N$_2$ flux: $6\times10^{-3}$ sccm
  H$_2$ flux: 3.0 slm
  substrate temperature: 1560° C.
  growth time: 360 minutes FIG. 5 is a graph that shows, with respect to the active layer 6 of a SiC wafer of 4H—SiC (03-38) having buffer layers with various thicknesses, the buffer layer thickness dependence of the diffraction peak half-width (FWHM) determined from X-ray diffraction locking curve measurement. Five-crystal X-ray diffraction featuring Ge single crystal (400) diffraction was used for the X-ray diffraction, and the crystallinity of the sample was evaluated from the half-width value of the SiC {03-38} diffraction peak (2θ= 41.4 degrees). The half-width value of the diffraction peak obtained by measuring a 4H—SiC (03-88) substrate was approximately 22 to 28 arcsec, and averaged 25 arcsec. This average value is indicated by the dotted line in FIG. 5.

With the SiC wafer active layer 6 in which a high-purity n-type SiC layer (24 μm) was grown directly on a substrate without using a buffer layer, the half-width value of the X-ray locking curve was 28 arcsec, which is inferior to that of the SiC substrate 2 (indicated by the black square in FIG. 5). This situation is improved by introducing an n-type buffer layer. Specifically, when the buffer layer thickness is 0.1 μm, a half-width (26 arcsec) slightly worse than the half-width value of the substrate (25 arcsec) was obtained, but when the thickness of the buffer layer was at least 0.3 μm, the half-width was smaller than that of the substrate, indicating that crystallinity had been improved by epitaxial growth.

In particular, when the thickness of the buffer layer was about 1.2 μm or more, the half-width was fairly constant at 16 arcsec. When the dislocation density on the {03-38} plane was evaluated by molten KOH etching, it was found to be $3\times10^4$ cm$^{-2}$ with the substrate, $3\times10^4$ cm$^{-2}$ with an active layer grown without a buffer layer, and from $1\times10^3$ cm$^{-2}$ to $4\times10^3$ cm$^{-2}$ with an active layer provided with a buffer layer of at least 2 μm, which clearly demonstrates the effect of the buffer layer.

The reason the buffer layer is so effective in the production of a high-quality SiC epitaxial growth layer is believed to be that the buffer layer reduces the strain that originates in lattice mismatching present between the SiC substrate doped with a high impurity concentration and the high-purity SiC active layer doped only to a low concentration.

In general, with SiC crystals containing an impurity in a concentration of about $10^{18}$ cm$^{-3}$ or higher, the lattice constant of the SiC crystals increases or decreases according to the type of impurity used. Furthermore, the proportional increase or decrease in the lattice constant is greater on a {03-38} plane than on a {0001} plane. Therefore, when epitaxial growth is performed on a 4H—SiC {03-38} substrate, it is effective to reduce the lattice strain originating in lattice mismatching by providing a SiC buffer layer having an impurity density midway between the impurity density values for the substrate and the active layer formed on this substrate for the purpose of producing a device.

Usually, in the production of a vertical power device, a substrate that has been doped with an impurity (donor or acceptor) in a high concentration is used in order to lower the resistance of the substrate, so it is best to provide a SiC buffer layer that has been doped at an impurity density lower than that of this substrate, but higher than that of the active layer. Nitrogen (N) doped n-type SiC was used in the above example, but the buffer layer was found to have the same effect in experiments using phosphorus (P) doped n-type SiC and aluminum (Al) and boron (B) doped p-type SiC.

As mentioned above, the density of the impurity contained in the buffer layer 4 is preferably at least $2\times10^{15}$ cm$^{-3}$ and no more than $3\times10^{19}$ cm$^{-3}$, but strain originating in lattice mismatching due to a difference in impurity densities can be further suppressed by reducing the impurity density in the buffer layer 4 from the interface with the SiC substrate 2 toward the interface with the SiC active layer 6.

EXAMPLE 3

Figure 6:
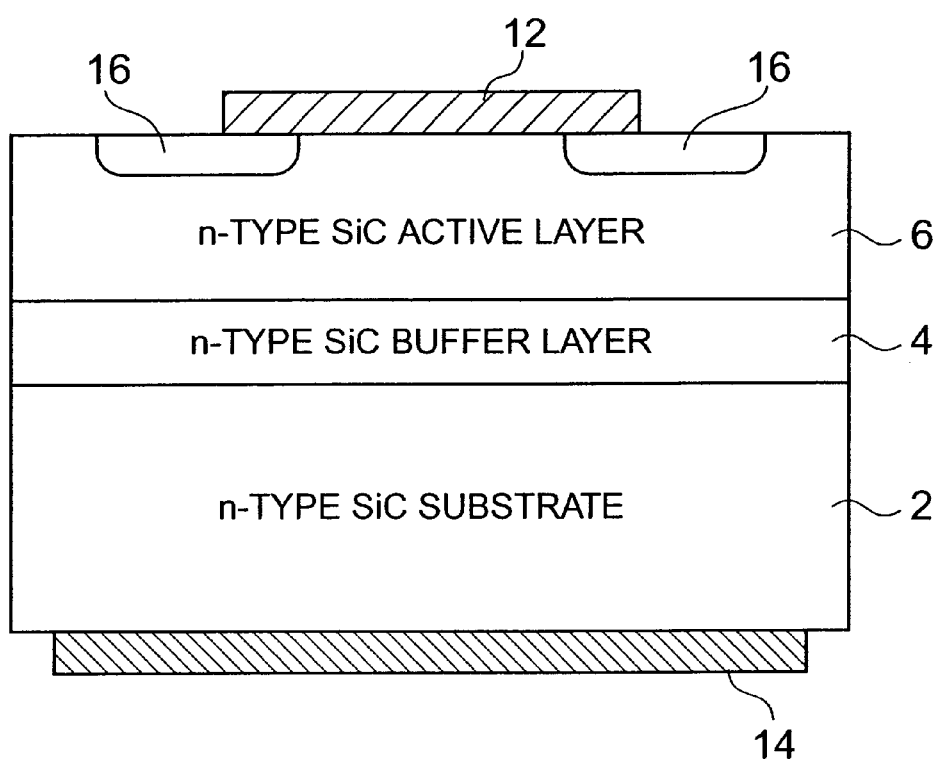
FIG. 6 is a side view illustrating the structure of a SiC Schottky diode.

In this example, a high-voltage-resistance diode with the structure shown in the side view of FIG. 6 was produced using SiC wafers made using a 4H—SiC {03-38} substrate and a (0001) 8-degrees off substrate. The SiC substrates 2 were produced by growing an ingot by modified Rayleigh process on 4H—SiC (000-1) seed crystals, slicing this ingot at an angle of 54.7° to the growth direction, and then mirror polishing the slice. The substrates were both n-type, the effective donor density determined from the capacity-voltage characteristics of a Schottky barrier was $6\times10^{18}$ $cm^{-3}$ to $7\times10^{18}$ $cm^{-3}$, and the thickness was approximately 330 to 340 µm. A nitrogen-doped n-type 4H—SiC layer was epitaxially grown by CVD on these SiC substrates 2.

Just as in Example 2, the buffer layer 4 was formed in a total thickness of approximately 1.5 µm, by approximately 0.3 µm for each layer while the donor density was varied in steps from $3\times10^{18}$ $cm^{-3}$ to $1\times10^{16}$ $cm^{-3}$, after which a high-purity n-type 4H—SiC layer, the active layer 6, was formed. The donor density of the active layer was $6\times10^{15}$ $cm^{-3}$ and the thickness was 16 µm.

The similar buffer layer and active layer were grown on the 4H—SiC (0001) 8-degrees off substrate to produce a SiC wafer. The main growth conditions here are given below. Since the nitrogen or other dopant impurity incorporation efficiency depends on the SiC crystal plane orientation, when a device is produced, the raw material gas flux and dopant raw material feed amount during CVD growth must be adjusted according to the crystal plane orientation being used.

Buffer Layer $SiH_4$ flux: 0.30 sccm
  $C_3H_8$ flux: 0.20 sccm
  $N_2$ flux: $2\times10^{-3}$ to 0.5 sccm
  $H_2$ flux: 3.0 slm
  substrate temperature: 1520° C.
  growth time: 60 minutes Active Layer $SiH_4$ flux: 0.50 sccm
  $C_3H_8$ flux: 0.50 sccm
  $N_2$ flux: $1\times10^{-3}$ to $4\times10^{-3}$ sccm
  $H_2$ flux: 3.0 slm
  substrate temperature: 1520° C.
  growth time: 240 minutes In addition, a Schottky electrode 12 and an ohmic electrode 14 were formed on each SiC wafer made using the 4H—SiC (0-33-8) substrate and (0001) 8-degrees off substrate thus produced. The Schottky electrode 12 was formed on the top side of the active layer 6, while the ohmic electrode 14 was formed on the bottom side of the SiC substrate 2. Titanium (Ti: 180 nm) was used for the Schottky electrode 12, while nickel (Ni: 200 nm) that had been heat treated for 20 minutes at 1000° C. was used for the ohmic electrode 14. The Schottky electrode 12 was circular, and its diameter was varied between 100 µm and 3 mm.

A high-resistance p-type region (guard ring) 16 was formed by implanting boron (B) ions in order to reduce field bunching at the end of the Schottky electrode 12, which completed a Schottky diode. The boron ions were implanted in four steps, comprising 120 keV, 80 keV, 50 keV, and 30 keV, for a total dose of $3\times10^{13}$ $cm^{-2}$.

The width of the p-type region 16 where the guard ring was formed was 100 µm, and the width of the portion where this p-type region 16 overlapped the Schottky electrode 12 was 10 µm. The ion implantation was performed at room temperature, and the heat treatment (annealing) for implanted ion activation was conducted for 30 minutes at 1550° C. in an argon gas atmosphere. Photolithography was used to pattern the electrode metal and the selective ion implantation mask.

Figure 7:
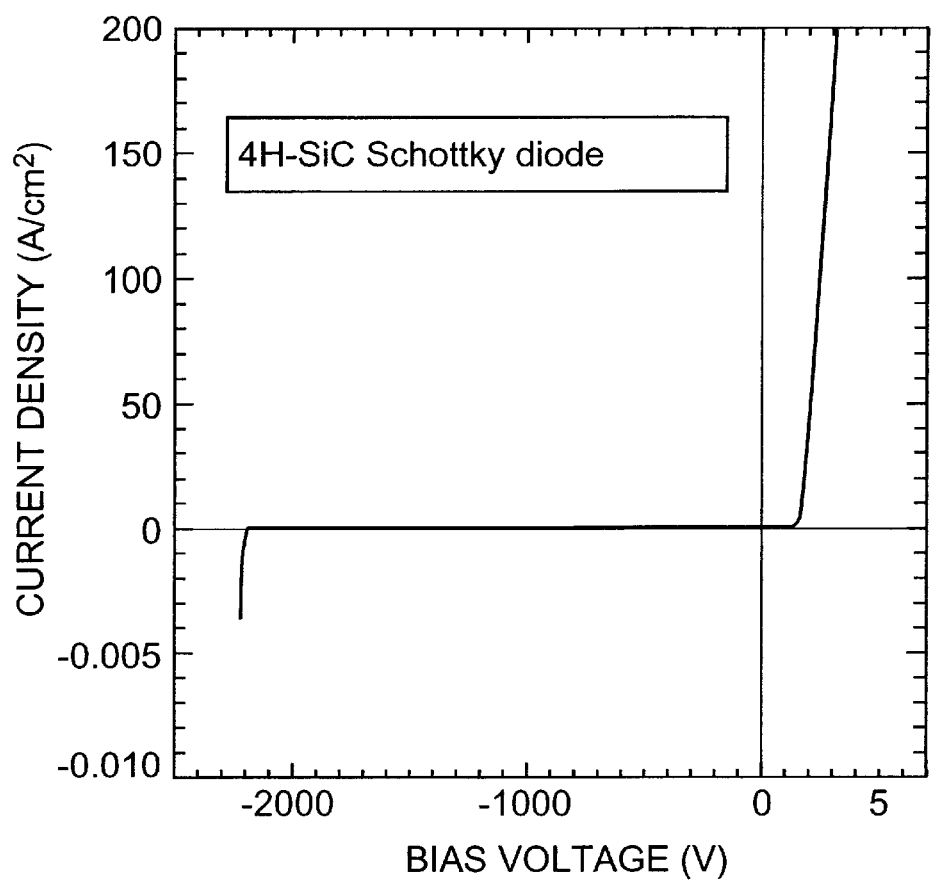
FIG. 7 is a graph of the current-voltage characteristics of a Schottky diode produced using a SiC active layer grown on a 4H—SiC (0-33-8) substrate.

FIG. 7 is a graph of the typical current density-voltage characteristics of the Schottky diode produced above. This diode was produced from an SiC wafer having a buffer layer provided over a 4H—SiC (0-33-8) substrate, and the electrode diameter was 500 µm. With reverse characteristics, a voltage resistance of 2200 V was attained, and the leak current when −1000 V was applied was only $3\times10^{-6}$ $A/cm^2$. With forward characteristics, the ON voltage (voltage drop at a current density of 100 $A/cm^2$) was 1.2 V, and the ON resistance was $4\times10^{-3}$ Ω $cm^2$, both of which are extremely good. Similar diode characteristics were obtained with the 4H—SiC (0001) 8-degrees off substrate when the diode has a small electrode surface area of 300 µm or less, but a large difference was seen between the two when the diode had a large electrode surface area.

Figure 8:
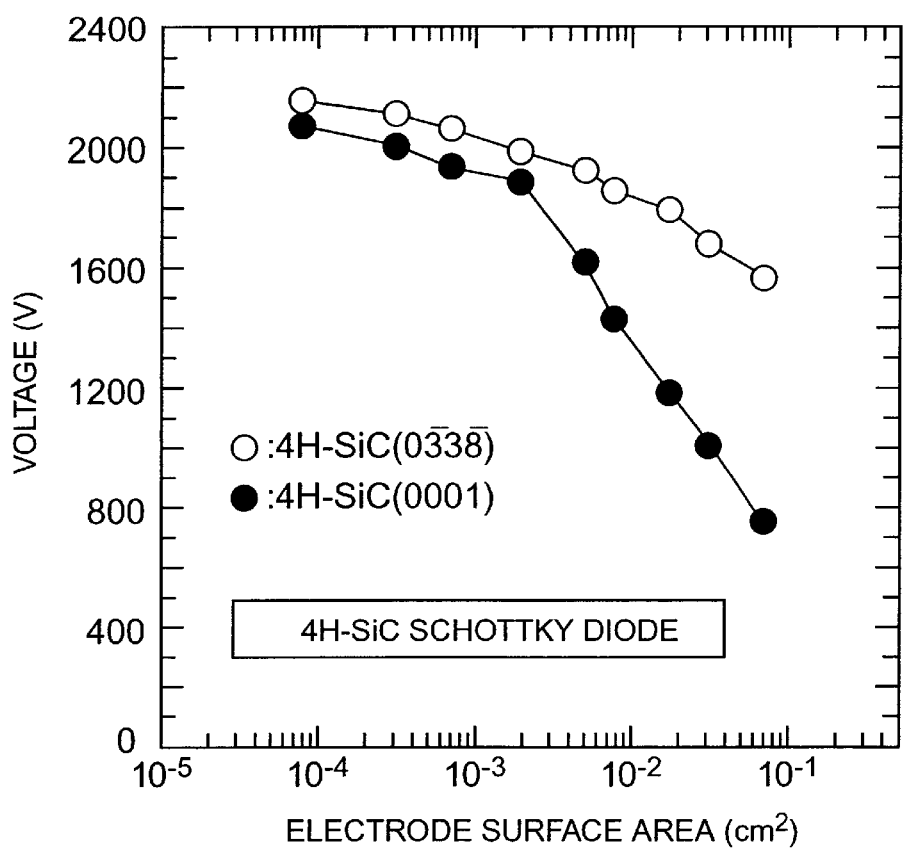
FIG. 8 is a graph of the relationship between voltage resistance and electrode surface area of a 4H—SiC Schottky diode.

FIG. 8 is a graph of the electrode surface area dependence of the voltage resistance (average value) for a Schottky diode produced using SiC wafers in which the active layer was grown over two types of SiC substrate: a 4H—SiC (0-33-8) substrate and a 4H—SiC (0001) 8-degrees off substrate. At least twelve diodes were measured for each electrode surface area to find the average voltage resistance. With a Schottky diode produced using a layer grown on a 4H—SiC (0001) 8-degrees off substrate, there was a sharp decrease in voltage resistance when the electrode surface area exceeded $5\times10^{-3}$ $cm^2$ to $1\times10^{-2}$ $cm^2$.

In contrast, when an epitaxial growth layer was produced by providing a buffer layer over the 4H—SiC (0-33-8) substrate, high voltage resistance was maintained even at an electrode surface area of about $1\times10^{-2}$ $cm^2$, and even at $7\times10^{-2}$ $cm^2$, voltage resistance of at least 1700 V was obtained at a yield of at least 40%. If we compare not only voltage resistance, but also the average leak current density when −1000 V is applied using a diode with an electrode diameter of 500 µm, we see that this average was $8\times10^{-5}$ $A/cm^2$ with a diode produced on a 4H—SiC (0001) 8-degrees off substrate, whereas it was an extremely low $9\times10^{-6}$ $A/cm^2$ with a diode on the (0-33-8) plane.

This is thought to be because the use of the 4H-SiC (0-33-8) plane reduces the number of micropipes and screw dislocations that pass through from the SiC substrate to the active layer, and employing a buffer layer gives SiC crystals of higher quality. Moreover, the use of the 4H—SiC (0-33-8) plane affords better flatness of the growth surface, and also has the effect of reducing field bunching at the Schottky electrode/SiC interface.

A Schottky diode of the same high performance was obtained using the (03-38) plane. Although this example involved the production of a Schottky diode, the use of a 4H—SiC {03-38} substrate is also effective with a pin diode, a pnpn or npnp thyristor, or a pn junction diode formed by ion implantation or epitaxial growth.

EXAMPLE 4

Figure 9:
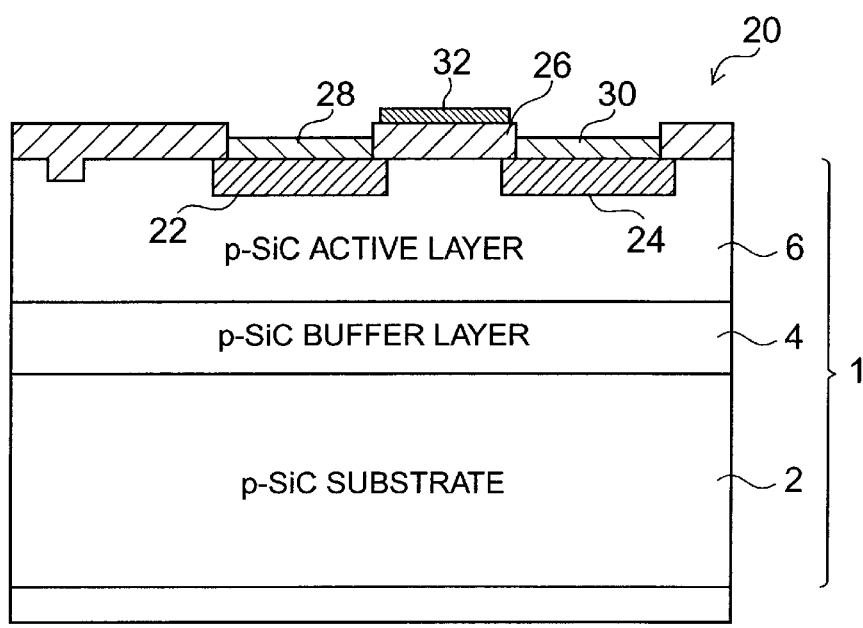
FIG. 9 is a side view illustrating the structure of a MOSFET.

With this example, an n-channel reversed MOSFET 20 with the structure shown in the side view of FIG. 9 was produced using SiC wafers formed made using a 4H—SiC {03-38} substrate and a (0001) 8-degrees off substrate. The SiC substrates 2 comprised a 4H—SiC (03-38) substrate, a 4H—SiC (0-33-8) substrate, and a 4H—SiC (0001) 8-degrees off substrate, produced by growing an ingot by modified Rayleigh process, slicing this ingot, and then mirror polishing the slice.

The SiC substrates 2 were all p-type, the effective acceptor density determined from the capacity-voltage characteristics of a Schottky barrier was $2\times10^{18}$ cm$^{-3}$ to $5\times10^{18}$ cm$^{-3}$, and the thickness was 320 to 340 μm. A boron-doped p-type SiC layer was epitaxially grown by CVD on these SiC substrates 2.

First, the buffer-layer 4 was formed in a total thickness of approximately 1.6 μm, by approximately 0.4 μm for each layer while the acceptor density was varied in steps from $8\times10^{17}$ cm$^{-3}$ to $1\times10^{16}$ cm$^{-3}$, after which a high-purity p-type SiC layer, the active layer 6, was formed. The acceptor density of the active layer 6 was $5\times10^{15}$ cm$^{-3}$ and the thickness was 5 μm. The main growth conditions here are given below.

Buffer Layer
- SiH$_4$ flux: 0.30 sccm
- C$_3$H$_8$ flux: 0.20 sccm
- B$_2$H$_6$ flux: $8\times10^{-5}$ to $7\times10^{-3}$ sccm
- H$_2$ flux: 3.0 slm
- substrate temperature: 1500° C.
- growth time: 70 minutes Active Layer
- SiH$_4$ flux: 0.48 sccm
- C$_3$H$_8$ flux: 0.64 sccm
- B$_2$H$_6$ flux: $4\times10^{-6}$ to $9\times10^{-6}$ sccm
- H$_2$ flux: 3.0 slm
- substrate temperature: 1500° C.
- growth time: 120 minutes In order to form source and drain regions, the SiC wafers produced above were then subjected to nitrogen (N) ion implantation to form low-resistance n-type regions 22 and 24. The nitrogen ions were implanted in four steps, comprising 140 keV, 80 keV, 50 keV, and 25 keV, for a total dose of $8\times10^{14}$ cm$^{-2}$.

The ion implantation was performed at room temperature, and the heat treatment for implanted ion activation was conducted for 30 minutes at 1550° C. in an argon gas atmosphere. An insulation layer 26 (gate oxide film) was then formed over the SiC wafer 1 by dry oxidation. When the SiC (0001) off substrate was used, the oxidation conditions comprised 3 hours at 1150° C., but with the SiC {03-38} sample, only 1 hour at 1150° C. The thickness of the insulation layer 26 was 35 to 46 nm.

Next, a source electrode 28 and a drain electrode 30 were formed on the n-type regions 22 and 24, respectively. Aluminum/titanium (250 nm Al, 30 nm Ti) was used for the source electrode 28 and drain electrode 30, and these were heat treated for 60 minutes at 800° C. An aluminum gate electrode 32 (200 nm thick) was formed over the insulation layer 26, after which a heat treatment was performed for 10 minutes at 450° C. in forming gas (H$_2$/N$_2$). Photolithography was used to pattern the electrode metal and the selective ion implantation mask.

The channel length of the MOSFET 20 was 30 μm, and the channel width was 200 μm. As to the direction of drain current flow, when a MOSFET was produced on a 4H—SiC (0001) 8-degrees off substrate, the crystal plane orientation was taken into account and the drain current was set to flow in the <11-20> direction or the <1-100> direction. When MOSFET was produced on a 4H—SiC {03-38} plane, the drain current was set to flow in the <11-20> direction or the <03-316> direction. The anisotropy of channel mobility was also examined.

Figure 10:
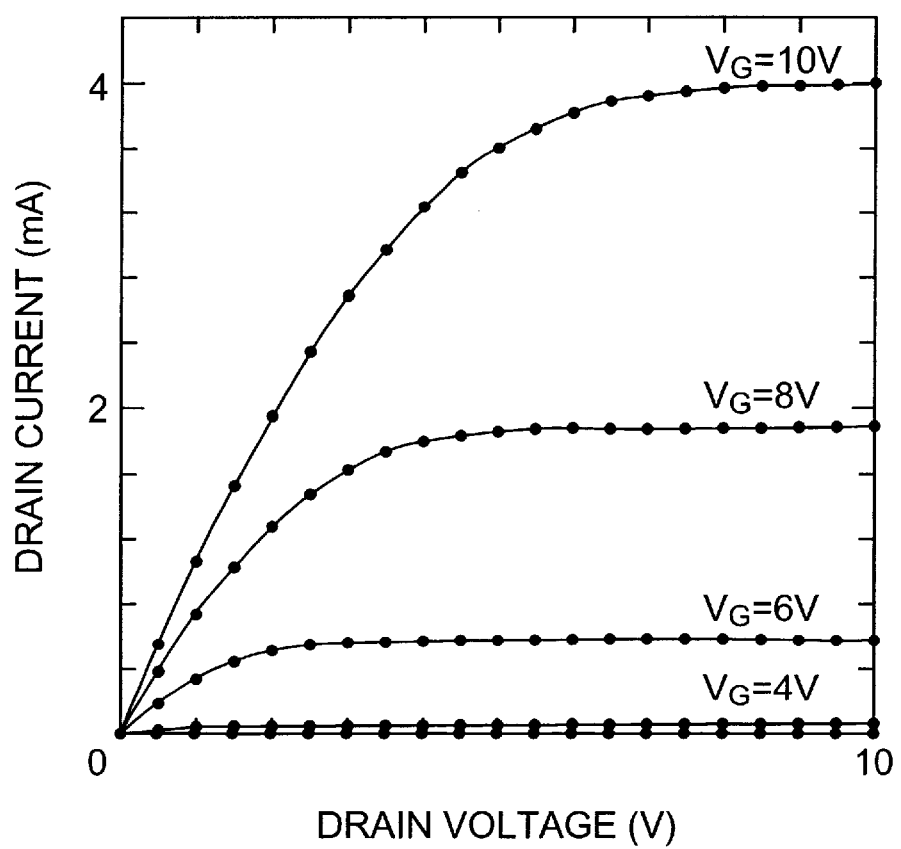
FIG. 10 is a graph of the current-voltage characteristics of a MOSFET produced using a SiC active layer grown on a 4H—SiC (03-38) substrate.

FIG. 10 is a graph of the typical drain characteristics of the MOSFET produced above. These are the characteristics of a MOSFET featuring an active layer grown over a 4H—SiC (03-38) substrate, in which the channel is parallel to the <11-20> axis. A linear region and a saturated region are clearly seen, and this MOSFET operates well as a normally-off MOSFET that switches off at a zero gate bias. FET operation was confirmed for all the MOSFETs in which other samples were used, but differences were noted in the channel mobility or threshold voltage.

FIG. 11 shows the average values for effective channel mobility determined from the linear region for each MOSFET. Channel mobility was measured by evaluating at least six MOSFETs for each sample, and taking the average thereof. As can be seen from FIG. 11, the channel mobility was far higher with all of the MOSFETs produced on the 4H—SiC (03-38) substrate and the 4H—SiC (0-33-8) substrate than with the MOSFETs produced on the 4H—SiC (0001) 8-degrees off substrate.

For instance, if we compare channel mobility in the <11-20> direction, we see that it is 4.8 cm$^2$/Vs with a MOSFET produced on a (0001) 8-degrees off substrate, whereas it is 93 cm$^2$/Vs with the (03-38) substrate and 96 cm$^2$/Vs with the (0-33-8) substrate, both of which are extremely high channel mobility values.

The reason for this seems to be that surface roughness caused by step bunching is reduced by the active layer 6 on the {03-38} substrate, yielding an extremely flat-MOS interface, and scattering that would otherwise be caused by surface roughness is in turn reduced. Furthermore, a comparison of a (0001) substrate with a {03-38} substrate reveals that there are fewer SiC bonds per unit of surface area in the {03-38} plane, so the interface level density formed at the MOS interface when an oxide film is produced is lower in the {03-38} plane. It can also be seen from FIG. 11 that the anisotropy in channel mobility is low.

The above results indicate that channel mobility will be high and anisotropy low with a MOSFET produced on a 4H—SiC {03-38} substrate, so the use of this substrate is effective in the production of high performance MOSFETs, IGBTs (Insulated Gate Bipolar Transistors), MOS gate thyristors, and so forth.

The insulation layer 26 used for a gate electrode was formed above by thermal oxidation, but the use of 4H—SiC {03-38} is also effective when an SiO$_2$ film is deposited by CVD. Also, a reverse MOSFET was produced here in order to examine the characteristics at the MOS interface, but since good oxide film/SiC interface characteristics are obtained when 4H—SiC {03-38} is used, it can also be applied to the production of other devices. For instance, when thermal oxidation or chemical vapor deposition is used to form a surface protection film for a SiC semiconductor device in which the first layer is an oxide film, the resulting interface characteristics will be extremely stable and the carrier generation rate at the interface will be low.

Industrial Applicability

As described above, the SiC wafer, SiC semiconductor device, and SiC wafer manufacturing method pertaining to the present invention can be applied as a SiC wafer, etc., with which there is little anisotropy in electron mobility in the case of use as a semiconductor device, and there is less strain caused by lattice mismatching between the SiC substrate and the SiC epitaxial growth layer.

More specifically, Using a SiC substrate whose crystal plane orientation is substantially {03-38} reduces the number of micropipes and screw dislocations that pass through and are exposed on the surface, and also reduces the incidence of stacking faults and the surface exposure thereof. Furthermore, using a 4H polytype substrate lowers the anisotropy of electron mobility in the active layer grown over the SiC wafer. Because a buffer layer composed of SiC is formed over the SiC substrate, when a SiC active layer is grown on the wafer, it is possible to prevent strain from occurring in the SiC active layer as a result of lattice mismatching between the SiC substrate and the SiC active layer.

Using the above-mentioned SiC wafer makes it possible to produce many different types of SiC semiconductor device, such as power devices with extremely high performance, high efficiency, and high voltage resistance, high frequency power devices, and high temperature devices.

What is claimed is:

1. A SiC wafer, comprising:
    a 4H polytype SiC substrate in which the crystal plane orientation is substantially {03-38}; and
    a buffer layer composed of SiC formed over said SiC substrate.

2. The SiC wafer according to claim 1, wherein the thickness of said buffer layer is at least 0.1 $\mu$m but no more than 15 $\mu$m.

3. The SiC wafer according to claim 1, wherein said buffer layer contains at least one impurity from among nitrogen, phosphorus, aluminum, and boron, and the density of the impurity in said buffer layer is at least $2 \times 10^{15}$ cm$^{-3}$ but no more than $3 \times 10^{19}$ cm$^3$.

4. The SiC wafer according to claim 3, wherein the density of the impurity in said buffer layer is lower than the density of the impurity in said SiC substrate.

5. The SiC wafer according to claim 1, further comprising an active layer composed of SiC over said buffer layer.

6. The SiC wafer according to claim 5, wherein the density of the impurity in said buffer layer decreases from the interface with said SiC substrate toward the interface with said active layer composed of SiC.

7. A SiC semiconductor device, comprising:
    a 4H polytype SiC substrate in which the crystal plane orientation is substantially {03-38};
    a buffer layer composed of SiC formed over said SiC substrate; and
    an active layer composed of SiC over said buffer layer.

8. The SiC semiconductor device according to claim 7, wherein a metal layer is provided on the surface of said active layer composed of SiC, and a Schottky barrier is formed by said active layer and said metal layer.

9. The SiC semiconductor device according to claim 7, having a pn junction formed by epitaxial growth or ion implantation.

10. The SiC semiconductor device according to claim 7, having an oxide film formed by thermal oxidation or chemical vapor deposition as a gate insulation film.

11. The SiC semiconductor device according to claim 7, having an oxide film formed by thermal oxidation or chemical vapor deposition as part of a surface protection film.

12. A method for manufacturing a SiC wafer, wherein a buffer layer composed of SiC is grown over a 4H polytype SiC substrate in which the crystal plane orientation is substantially {03-38}.

13. The method for manufacturing a SiC wafer according to claim 12, wherein an active layer.

* * * * *